(12) United States Patent
Fujino et al.

(10) Patent No.: US 10,008,691 B2
(45) Date of Patent: Jun. 26, 2018

(54) ARRAY SUBSTRATE AND MANUFACTURING METHOD THEREOF, DISPLAY PANEL AND DISPLAY DEVICE

(71) Applicant: BOE TECHNOLOGY GROUP CO., LTD., Beijing (CN)

(72) Inventors: Seiji Fujino, Beijing (CN); Song Zhang, Beijing (CN); Jing Gao, Beijing (CN); Tao Wang, Beijing (CN); Xiaobo Du, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days. days.

(21) Appl. No.: 15/093,906

(22) Filed: Apr. 8, 2016

(65) Prior Publication Data
US 2017/0077441 A1  Mar. 16, 2017

(30) Foreign Application Priority Data

Sep. 10, 2015  (CN) .......................... 2015 1 0574863

(51) Int. Cl.
*H01L 51/52* (2006.01)
*H01L 27/32* (2006.01)

(52) U.S. Cl.
CPC ...... *H01L 51/5246* (2013.01); *H01L 27/3244* (2013.01); *H01L 2227/323* (2013.01)

(58) Field of Classification Search
CPC . H01L 51/5246; H01L 51/56; H01L 27/3244; H01L 2227/323
USPC .......................................................... 257/40
See application file for complete search history.

(56) References Cited

U.S. PATENT DOCUMENTS

| 2010/0258346 A1* | 10/2010 | Chen ....................... H01L 21/56 174/521 |
| 2010/0320909 A1* | 12/2010 | Izumi .................. H01L 27/3246 315/51 |
| 2012/0064278 A1 | 3/2012 | Chen |
| 2014/0192491 A1 | 7/2014 | Chiang et al. |

FOREIGN PATENT DOCUMENTS

| CN | 101930992 A | 12/2010 |
| CN | 103531095 A | 1/2014 |
| CN | 103929880 A | 7/2014 |
| CN | 104167426 A | 11/2014 |

OTHER PUBLICATIONS

Chinese Office Action dated Jun. 28, 2017.
Chinese Office Action dated Sep. 21, 2017.
Chinese Office Action dated Dec. 25, 2017.

* cited by examiner

*Primary Examiner* — Fernando L Toledo
*Assistant Examiner* — Adam S Bowen
(74) *Attorney, Agent, or Firm* — Dilworth & Barrese, LLP.; Michael J. Musella, Esq.

(57) ABSTRACT

An array substrate and manufacturing method thereof, display panel and display device are disclosed. The array substrate includes a display region and a packaging region surrounding the display region. The packaging region is provided with a packaging planarization layer, the packaging planarization layer includes a plurality of packaging planarization units, and each of the packaging planarization units is formed as a ring shaped pattern in the packaging region and configured to surround the display region.

12 Claims, 2 Drawing Sheets

ARRAY SUBSTRATE AND MANUFACTURING METHOD THEREOF, DISPLAY PANEL AND DISPLAY DEVICE

TECHNICAL FIELD

At least one embodiment of the present disclosure relates to an array substrate and a manufacturing method thereof, a display panel and a display device.

BACKGROUND

Organic light emitting diode (OLED) display panels with advantages such as active driving luminescence, high brightness, high contrast ratio, ultrathin thickness, low power consumption, large viewing angle, wide working temperature range and so on pertain to an advanced new type flat plate display device with a broad application prospective. An OLED display panel mainly comprises a packaging substrate and an array substrate, the array substrate is provided with OLED devices, and a sealed structure is formed between the packaging substrate and the array substrate through a packaging technique; the packaging techniques mainly comprise a fit powder packaging technique and a RTB (Room Temperature Bonding) technique.

SUMMARY

At least one embodiment of the present disclosure provides an array substrate and manufacturing method thereof, display panel and display device, so as to improve the yield of existing arts in which a room temperature bonding technique is adopted for packaging.

An embodiment of the disclosure provides an array substrate, comprising: a display region and a packaging region surrounding the display region; the packaging region is provided with a packaging planarization layer, the packaging planarization layer comprises a plurality of packaging planarization units, and each of the packaging planarization units is formed as a ring shaped pattern in the packaging region and configured to surround the display region.

Another embodiment of the disclosure provides a display panel, comprising a packaging substrate and the aforesaid array substrate; the packaging region of the array substrate is provided with a first room temperature bonding layer, and the packaging region of the array substrate is provided with a second room temperature bonding layer.

Further another embodiment of the disclosure provides a display device, comprising the aforesaid display panel.

Still further another embodiment of the disclosure provides a manufacturing method of an array substrate, the array substrate comprises a display region and a packaging region surrounding the display region, the packaging region is provided with a packaging planarization layer, and the method comprises: forming a plurality of packaging planarization units in the packaging region, wherein each of the packaging planarization units is formed as a ring shaped pattern in the packaging region and configured to surround the display region.

BRIEF DESCRIPTION OF THE DRAWINGS

The present disclosure will become more fully understood from the detailed description given hereinafter and the accompanying drawings which are given by way of illustration only, and thus are not limitative of the present disclosure and wherein.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Figure 1:
FIG. 1 is a schematic diagram of a display panel formed by using a room temperature bonding technique.

FIG. 1 is an OLED display panel formed by using a RTB (Room Temperature Bonding) packaging technique, a room temperature bonding layer 210' is formed in a packaging region of a packaging substrate 200', a room temperature bonding layer 120' is formed in a packaging region of an array substrate 100', and then a sealed structure between the two substrates is formed by aligning, laminating and bonding the two substrates. In the structure shown in FIG. 1, because the surface of the packaging region of the array substrate is generally formed with peripheral circuits having a concave-convex surface, in order to improve the yield of packaging, a packaging planarization layer 110' needs to be formed in the packaging region of the array substrate before the packaging process.

In the research, the inventors of the present application has noted that, if there exist dust or other defects on the surface of the formed packaging planarization layer during packaging, adverse effect on the packaging effect will also be caused.

At least one embodiment of the present disclosure provides an array substrate, the array substrate comprises a display region and a packaging region surrounding the display region, the packaging region is provided with a packaging planarization layer, the packaging planarization layer comprises a plurality of packaging planarization units, each of the packaging planarization units is formed as a ring shaped pattern in the packaging region and configured to surround the display region.

In the array substrate provided by an embodiment of the present disclosure, the packaging planarization layer in a packaging region is configured in a plurality of ring shaped packaging planarization units, and therefore in the subsequent packaging processes, the contact area between the formed room temperature bonding layer and the packaging planarization layer can be increased and the strength of bonding force between these two layers can be improved. Besides, because the packaging planarization layer is divided into a plurality of unit structures that are independent from each other, even if there exist dust or other defects on the surface of one of the unit structures, it is not easy to cause adverse effect on the sealing of the other unit structures and a room temperature bonding layer, in this way, the yield of the packaging process is improved. Moreover, compared with the technique illustrated in FIG. 1, toughness of the packaging planarization layer of the abovementioned structure becomes better, and therefore the probability of fracture when being bended can be decreased.

In the embodiments of the present disclosure, the number of the packaging planarization units in the packaging planarization layer may be disposed according to the specific situations in practice; for example, 2-6 packaging planarization units may be disposed in the packaging region as a packaging planarization layer. For example, the material of the packaging planarization layer may comprise polyimide, phenol, acrylic, epoxy or other resin material.

Figure 2:
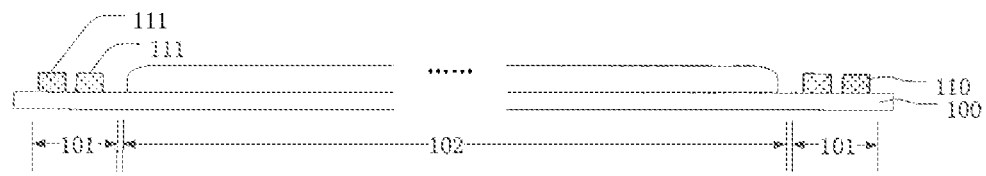
FIG. 2 is a schematic diagram of an array substrate provided by the embodiments of the present disclosure.

FIG. 2 is a schematic diagram of an array substrate provided by the embodiments of the present disclosure, the array substrate 100 comprises a display region 102 and a packaging region 101 surrounding the display region 102, the packaging region 101 is provided with a packaging planarization layer 110, and the packaging planarization layer comprises two packaging planarization units 111, which are provided side by side.

Figure 3:
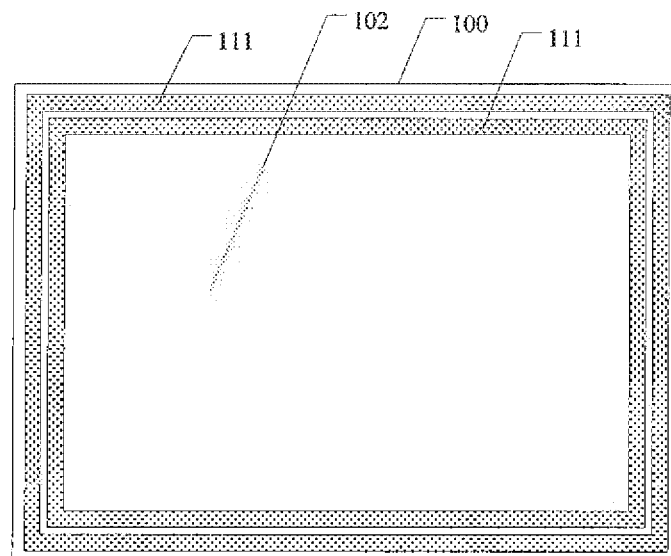
FIG. 3 is a plan view of the array substrate in FIG. 2.

FIG. 3 is a plan view of the array substrate in FIG. 2; as shown by FIG. 3, each of the packaging planarization units 111 is formed as a ring shaped pattern and configured to surround the display region.

Figure 4:
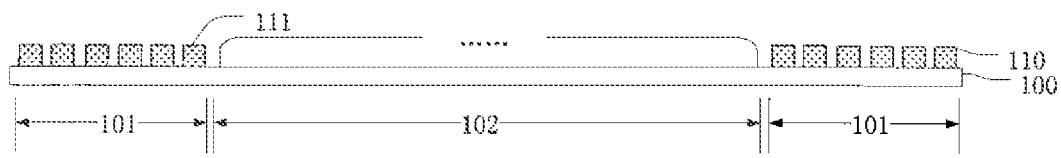
FIG. 4 is a schematic diagram of another array substrate provided by the embodiments of the present disclosure.

FIG. 4 is a schematic diagram of another array substrate provided by an embodiment of the present disclosure, the array substrate 100 comprises a display region 102 and a packaging region 101 surrounding the display region 102, the packaging region 101 is provided with a packaging planarization layer 110, and the packaging planarization layer comprises six packaging planarization units 111, which are provided side by side. Each of the packaging planarization units 111 is formed as a ring shaped pattern and configured to surround the display region (the configuration of the ring shaped patterns can refer to FIG. 3).

Figure 5:
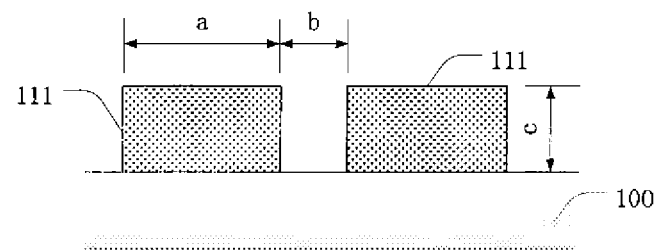
FIG. 5 is a schematic diagram of two adjacent packaging planarization units in a packaging planarization layer provided by the embodiments of the present disclosure.

For example, in order to further improve the yield of packaging, a plurality of packaging planarization units 111 in the packaging planarization layer 110 may be disposed coaxially (with referring to FIG. 3, the centers of the packaging planarization units 111 are same) and have the same ring width. FIG. 5 is a schematic diagram of two adjacent packaging planarization units in the packaging planarization layer provided by an embodiment of the present disclosure, for example, the ring width "a" of each packaging planarization unit 111 may be 1 µm-500 µm, for example, the ring width "a" of each packaging planarization unit 111 may be 100 µm-500 µm, for example, 200 µm, 300 µm or 400 µm. For example, the gap width "b" between two adjacent packaging planarization units 111 may be 10 µm-100 µm, for example, 30 µm, 50 µm or 80 µm.

For example, the height "c" of each packaging planarization unit 111 may be 2 µm-3 µm, for example, 2.2 µm or 2.5 µm. For example, the surface roughness Ra of each packaging planarization unit 111 may be less than 1 nm. For example, the height difference between two adjacent packaging planarization units 111 may be less than 90 nm.

The array substrate provided by the embodiments of the present disclosure may be an OLED array substrate, namely, the display region of the array substrate is provided with a plurality of OLED components. Certainly, the array substrates provided by the embodiments of the present disclosure may be used for any other array substrates which adopting a room temperature bonding technique or similar technique.

At least one embodiment of the present disclosure further provides a display panel, which comprises a packaging substrate and the array substrate provided by any one of the abovementioned embodiments. The packaging region of the array substrate is provided with a first room temperature bonding layer covering the packaging planarization layer, the packaging region of the packaging substrate is provided with a second room temperature bonding layer.

Figure 6:
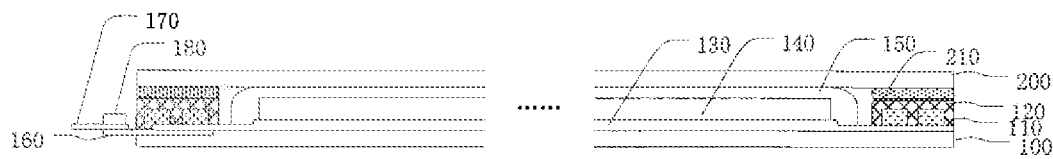
FIG. 6 is a schematic diagram of a display panel provided by the embodiments of the present disclosure.

FIG. 6 is a schematic diagram of a display panel provided by an embodiment of the present disclosure, and the display panel comprises an array substrate 100 and a packaging substrate 200 which are disposed opposite to each other.

For example, the display region (not shown in FIG. 6) of the array substrate 100 is provided with a TFT layer 130 (comprising a gate electrode layer, a gate insulating layer, an active layer and a source-drain electrode layer), an OLED layer 140 and a packaging thin film layer 150; the packaging region (not shown in FIG. 6) of the array substrate 100 is provided with a peripheral circuit 160, a packaging planarization layer 110 and a first room temperature bonding layer 120; the peripheral circuit 160 is connected with a flexible printed circuit board 170 (FPC), the flexible printed circuit board 170 is provided with an integrated circuit chip 180 (IC chip), the packaging planarization layer 110 comprises a plurality of packaging planarization units (not shown in FIG. 6), and each packaging planarization unit is formed as a ring shaped pattern in the packaging region and configured to surround the display region.

For example, the packaging substrate 200 may be a transparent substrate (for example, a transparent glass substrate), or a color filter substrate (CF substrate) provided with a color filter layer, in which the packaging region (not marked in FIG. 6) is provided with a second room temperature bonding layer 210.

For example, both the first room temperature bonding layer 120 and the second room temperature bonding layer 210 may adopt Si (silicon) material and be respectively formed in the packaging regions of the array substrate and the packaging substrate through, for example, an ion beam scanning technique. Then, two substrates may be packaged together by using, for example, a SAB (Surface Atomic Bonding) technique, so as to form a sealed structure between the packaging substrate and the array substrate.

In the display panel provided by an embodiment of the present disclosure, the packaging planarization layer in the packaging region of the array substrate is configured to comprise a plurality of ring shaped packaging planarization units, which can increase the contact area between the first room temperature bonding layer and the packaging planarization layer and improve the strength of the bonding force between these two layers. Further, because the packaging planarization layer is divided into a plurality of unit structures which are independent from each other, even if there exists dust or other defects on the surface of one of the unit structures, it is not easy to cause adverse effect on the sealing of the other unit structures and the first room temperature bonding layer, and in this way the yield of the packaging process is improved. Moreover, compared with the technique illustrated in FIG. 1, the toughness of the packaging planarization layer of the abovementioned structure becomes better, so the probability of fracture when being bended may be decreased.

At least one embodiment of the present disclosure further provides a display device, which comprises the abovementioned display panel. The display devices provided by the embodiments of the present disclosure may be a notebook computer display screen, a display device, a television, a digital picture frame, a cell phone, a tablet computer or any other produce or component having a display function.

At least one embodiment of the present disclosure further provides a manufacturing method of an array substrate, the array substrate comprises a display region and a packaging region surrounding the display region, and the packaging region is provided with a packaging planarization layer. In the methods provided by the embodiments of the present disclosure, forming of the packaging planarization layer in the packaging region comprises: forming a plurality of packaging planarization units in the packaging region, each of the packaging planarization units is formed as a ring shaped pattern and configured to surround the display region.

For example, the packaging polarization units are disposed coaxially and each has the same ring width.

For example, the ring width of each packaging planarization unit is 100 μm-500 μm. For example, the gap width between two adjacent packaging planarization units is 10 μm-100 μm.

For example, the height of each of the packaging planarization units is 2 μm-3 μm. For example, the surface roughness of each of the packaging planarization units is smaller than 1 nm. For example, a height difference between two adjacent ones of the packaging planarization units is smaller than 90 nm.

For example, two to six packaging planarization units may be formed in the packaging region.

In the method provided by the embodiments of the present disclosure, the configuration of the components may refer to the embodiments of the array substrate, and the redundant content is not repeated here.

The present applicant claims the benefits of the Chinese patent application No. 201510574863.4, which was filed on Sep. 10, 2015, and the disclosure of which is incorporated herewith by reference as part of the present application.

What is claimed is:

1. A display panel, comprising a packaging substrate and an array substrate,
   wherein the array substrate comprises a display region and a packaging region surrounding the display region, the packaging region is provided with a packaging planarization layer, the packaging planarization layer comprises a plurality of packaging planarization units, and each of the packaging planarization units is formed as a ring shaped pattern in the packaging region and configured to surround the display region, and
   wherein the packaging region of the array substrate is provided with a first room temperature bonding layer, and the packaging region of the array substrate is provided with a second room temperature bonding layer.

2. A display device, comprising the display panel according to claim 1.

3. The display panel according to claim 1, wherein the packaging planarization units are disposed coaxially and have a same ring width.

4. The display panel according to claim 3, wherein the ring width of each of the packaging planarization units is 100 μm - 500 μm.

5. The display panel according to claim 4, wherein a gap width between two adjacent ones of the packaging planarization units is 10 μm - 100 μm.

6. The display panel according to claim 3, wherein a height of each of the packaging planarization units is 2 μm - 3 μm.

7. The display panel according to claim 6, wherein a height difference between two adjacent ones of the packaging planarization units is smaller than 90 nm.

8. The display panel according to claim 7, wherein a surface roughness of each of the packaging planarization units is smaller than 1 nm.

9. The display panel according to claim 1, wherein the packaging planarization layer comprises 2-6 packaging planarization units.

10. The display panel according to claim 1, wherein the array substrate is an organic light-emitting diode (OLED) array substrate.

11. The display panel according to claim 1, wherein a gap width between two adjacent ones of the packaging planarization units is 10 μm - 100 μm.

12. The display panel according to claim 1, wherein a height difference between two adjacent ones of the packaging planarization units is smaller than 90 nm.

* * * * *